United States Patent
Mano

(10) Patent No.: US 7,023,073 B2
(45) Date of Patent: Apr. 4, 2006

(54) NOISE SHIELD TYPE MULTI-LAYERED SUBSTRATE

(75) Inventor: Yasuhiko Mano, Suwon-si (KR)

(73) Assignee: Samsung Electro-Mechanics Co., Ltd., Kyinggi-Do (KR)

( * ) Notice: Subject to any disclaimer, the term of this patent is extended or adjusted under 35 U.S.C. 154(b) by 0 days.

(21) Appl. No.: 10/447,347

(22) Filed: May 28, 2003

(65) Prior Publication Data

US 2004/0018658 A1    Jan. 29, 2004

(30) Foreign Application Priority Data

Jul. 27, 2002    (KR) .................. 10-2002-0044441
Dec. 11, 2002    (KR) .................. 10-2002-0078765

(51) Int. Cl.
*H04L 23/552*    (2006.01)
*H01Q 11/10*    (2006.01)

(52) U.S. Cl. .................. 257/659; 343/792.5

(58) Field of Classification Search .................. None
See application file for complete search history.

(56) References Cited

U.S. PATENT DOCUMENTS

| | | | |
|---|---|---|---|
| 5,217,922 A | * | 6/1993 | Akasaki et al. .............. 438/125 |
| 6,097,080 A | * | 8/2000 | Nakanishi et al. .......... 257/659 |
| 2004/0001025 A1 | * | 1/2004 | Killen et al. .............. 343/792.5 |

FOREIGN PATENT DOCUMENTS

| | | |
|---|---|---|
| JP | 2000-277642 | 9/2000 |
| JP | 2000-302193 | 10/2000 |
| JP | 2001-284316 | 9/2001 |

\* cited by examiner

Primary Examiner—Zandra V. Smith
Assistant Examiner—Kiesha Rose
(74) Attorney, Agent, or Firm—Gottlieb, Rackman & Reisman, P.C.

(57) ABSTRACT

Disclosed is a noise shield type multi-layered substrate which is advantageous in terms of shielding leaked magnetic flux and cross-talk by disposing a magnetic material onto at least one of circuit patterns, passive components and active components, thus blocking noise generated from the circuit patterns, passive components and active components. Thus, malfunctions of neighboring circuit patterns and various parts due to leaked magnetic flux are prevented. A method of manufacturing the noise shield type multi-layered substrate is also provided.

22 Claims, 13 Drawing Sheets

NOISE SHIELD TYPE MULTI-LAYERED SUBSTRATE

BACKGROUND OF THE INVENTION

1. Field of the Invention

The present invention pertains, in general, to noise shield type multi-layered substrates and manufacturing methods thereof. More specifically, the present invention is directed to a multi-layered substrate having embedded electronic parts which function to absorb and shield noise or leaked magnetic flux generated from circuit patterns, passive components and active components, and a method of manufacturing the same.

2. Description of the Prior Art

In general, various electronic parts, such as active components and passive components, are mounted and wired on a patterned substrate. With advances in miniaturization and integration of electronic parts, the above mentioned electronic parts are mounted in a printed circuit board. That is, the electronic parts are interposed into a multi-layered substrate, thereby miniaturizing and integrating the substrate.

In this regard, in Japanese Patent Laid-open Publication No. 2002-93989, there is disclosed an electronic part and a manufacturing method thereof, in which a lithographic resin layer is laminated on a substrate, and then insert parts, such as semiconductor chips, resistors and capacitors, are integrally embedded in the lithographic resin layer. Referring to FIG. 1, there is shown a lithographic process, comprising forming the lithographic resin layer 1 with a concave recess thereon, mounting an insert part 2 in the recess of the resin layer 1, layering a lithographic resin layer 1c on the resin layer 1, forming a wire 3 on the inserted part 2 through a via-hole, and layering another resin layer 1d on the wire 3. Thereby, the insert part 2 is embedded between the lithographic resin layers 1 and 1c.

In Japanese Patent Laid-open Publication No. 2002-111222, there is disclosed a multi-layered substrate stable in temperature changes. As shown in FIG. 2, the multi-layered substrate comprises resin substrate layers 18, 22, 25 and 26 and ceramic substrate layer 11 laminated together. In addition, impedance components 12 through 17 are formed on both sides of the ceramic substrate 11, and an outermost layer of the resin substrate layers is provided with electronic parts 23 and 24.

In Japanese Patent Laid-open Publication No. 2002-176267, there is disclosed an electronic part, a circuit device and a manufacturing method thereof, and a semiconductor device. As shown in FIG. 3, a thin film electronic part 33 having a bump capable of electrically connecting layers is embedded in a substrate 30, whereby embedding of the electronic part and connection of layers are simultaneously realized. Thus, electronic circuit devices, for example, a wiring part 32, an electronic device 36 and a wiring pattern 37 are formed at high density in the substrate 30. In addition, the electronic part 33 has a concave recess having a shape complementary to the bump shape by means of a template, and then an electronic component without an electrode is formed on the template, thereby fabricating the fine bump-attached thin electronic part having excellent properties.

Typically, various electronic parts are mounted in the multi-layered substrate and capped with a resin to miniaturize and integrate the substrate. However, such circuit patterns including power lines, signal lines or ground lines, or passive components (resistors, capacitors, inductors, etc.) and active components (SMD parts, integrated circuits, etc.), mounted in the substrate, are not completely shielded from magnetic field. Thus, due to leaked magnetic flux of the electronic parts including the above circuit patterns or the passive and the active components, neighboring circuit patterns or passive and active components may malfunction, or cross-talk may occur from noise.

SUMMARY OF THE INVENTION

Therefore, it is an object of the present invention to solve the problems encountered in the prior art and to provide a method of manufacturing a multi-layered substrate having embedded noise shielding parts therein, for blocking leaked magnetic flux or noise generated from circuit patterns, passive components and active components by shielding the circuit patterns, the passive components and the active components embedded in the substrate.

Further, the passive components are exemplified by resistors, capacitors and inductors, and the active components include semiconductor chips, each of which is plated with ferrite.

It is another object of the present invention to provide a circuit pattern, a passive component and an active component which are subjected to shielding treatment.

It is further object of the present invention to provide a multi-layered substrate having embedded noise shielding parts therein by the above manufacturing method.

In order to accomplish the above objects, the present invention provides a method of manufacturing a multi-layered substrate having embedded noise shielding parts therein, in which a magnetic material is selectively disposed on a circuit pattern, a passive component or an active component disposed between substrates to shield noise generating from the circuit pattern, the passive component or the active component, thereby shielding leaked magnetic flux and cross-talk between neighboring circuit patterns, passive components or active components.

In addition, the present invention provides a method of manufacturing a multi-layered substrate having embedded noise shielding parts therein, comprising preparing a substrate, disposing a magnetic material on the substrate, forming a circuit pattern, a passive component and an active component onto the magnetic material-disposed substrate, disposing the magnetic material on the circuit pattern, the passive component and the active component, and layering another substrate on the magnetic material-disposed substrate.

Further, the present invention provides a noise shield type multi-layered substrate comprising a first substrate, a second substrate layered on the first substrate, a circuit pattern printed between the first substrate and the second substrate, and a magnetic material disposed to surround the circuit pattern printed between the first substrate and the second substrate.

BRIEF DESCRIPTION OF THE DRAWINGS

These and other objects and advantages of the invention will become apparent and more readily appreciated from the following description of the preferred embodiments, taken in conjunction with the accompanying drawings of which.

DETAILED DESCRIPTION OF THE INVENTION

Figure 1:
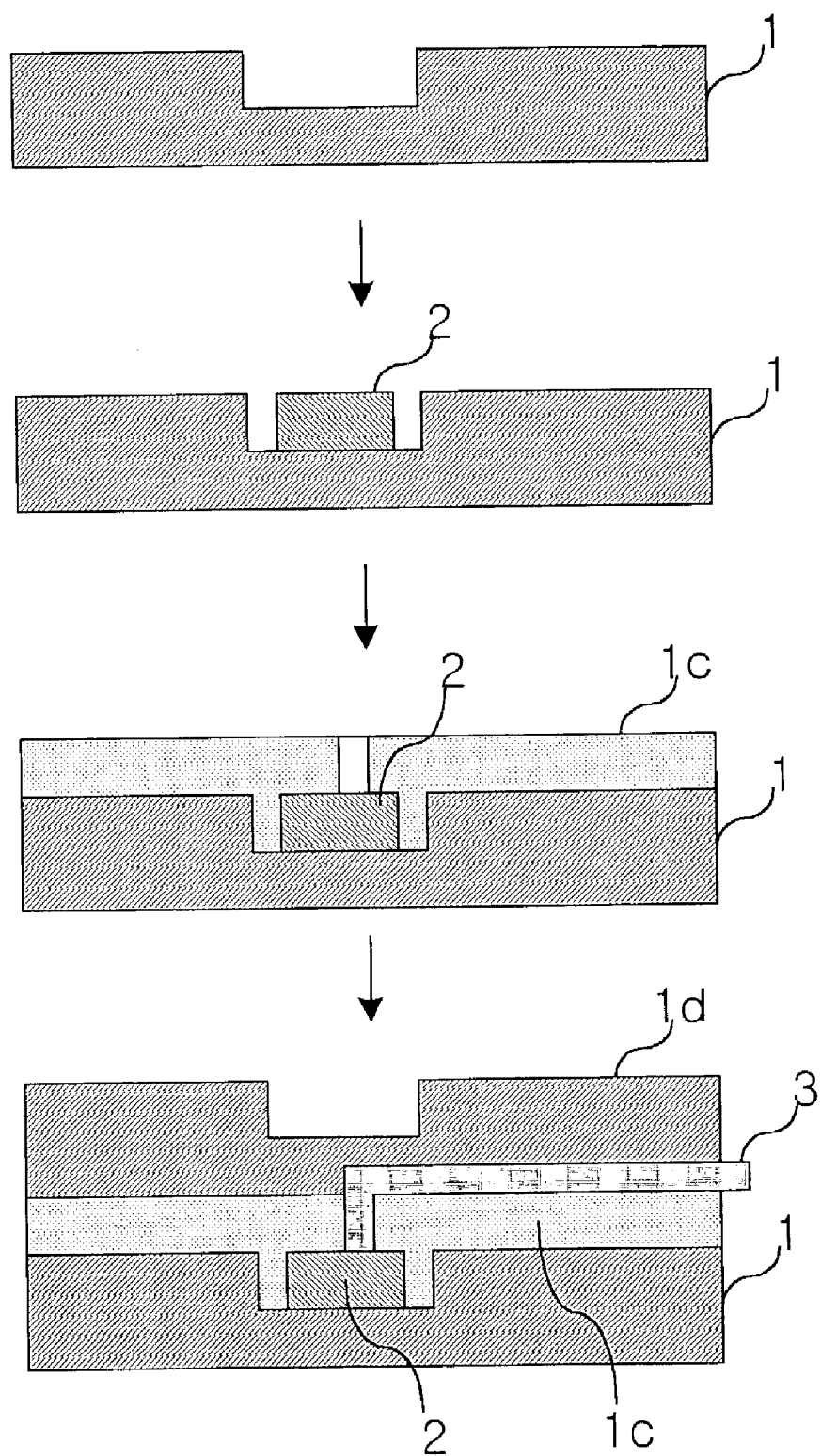
FIG. 1 is a sectional view schematically illustrating a multi-layered substrate, according to a primary embodiment of the prior art.
Figure 2:
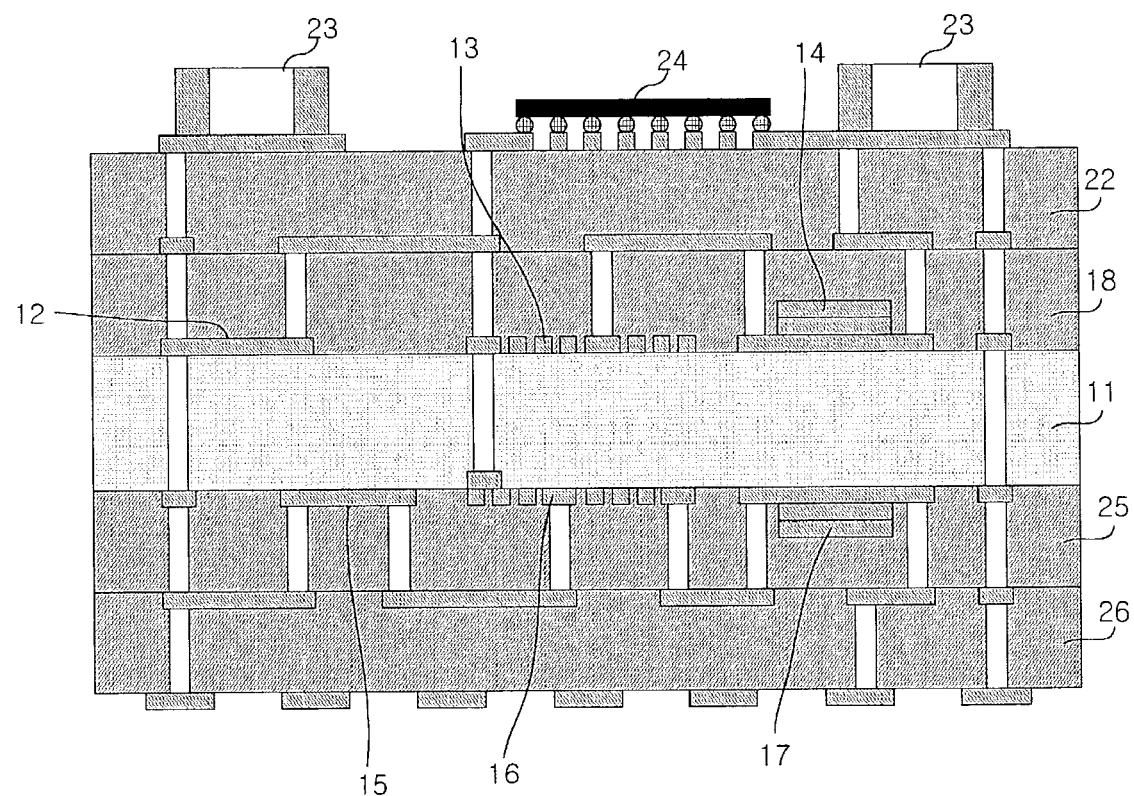
FIG. 2 is a sectional view schematically illustrating the multi-layered substrate, according to a second embodiment of the prior art.
Figure 3:
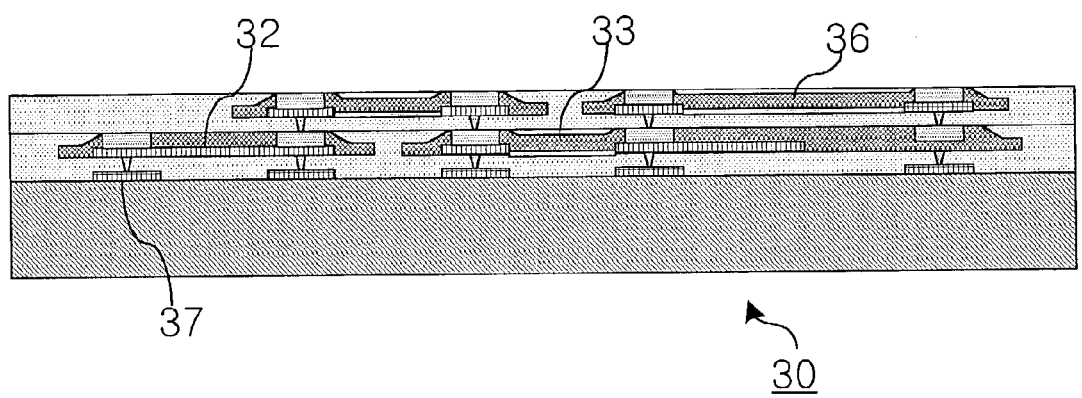
FIG. 3 is a sectional view schematically illustrating a multi-layered substrate, according to a third embodiment of the prior art.

Reference will now be made in detail to the present preferred embodiments of the present invention, examples of which are illustrated in the accompanying drawings, wherein like reference numerals refer to like elements throughout.

Figure 4A:
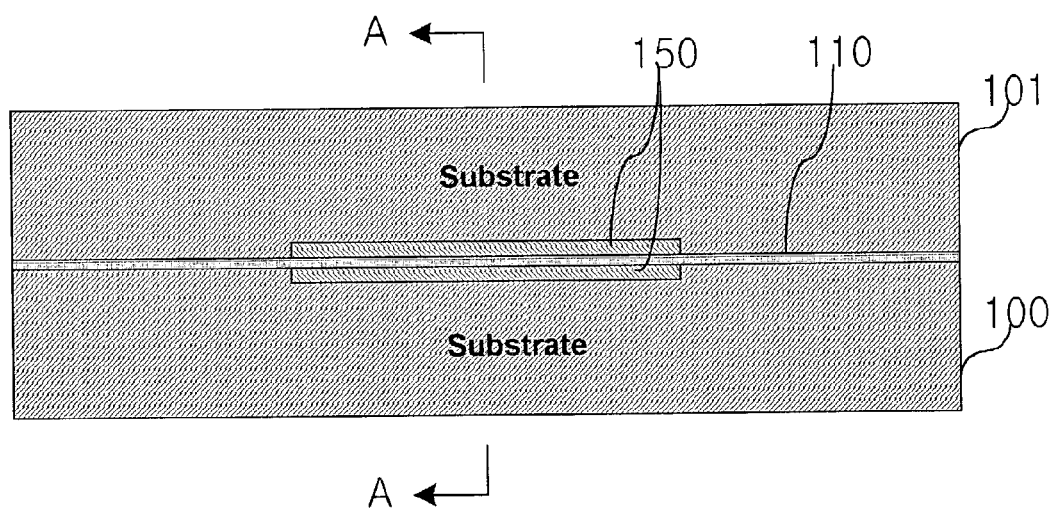
FIG. 4(a) is a longitudinal sectional view schematically illustrating a state of a noise shielding part being embedded in a multi-layered substrate, according to the present invention.
Figure 4B:
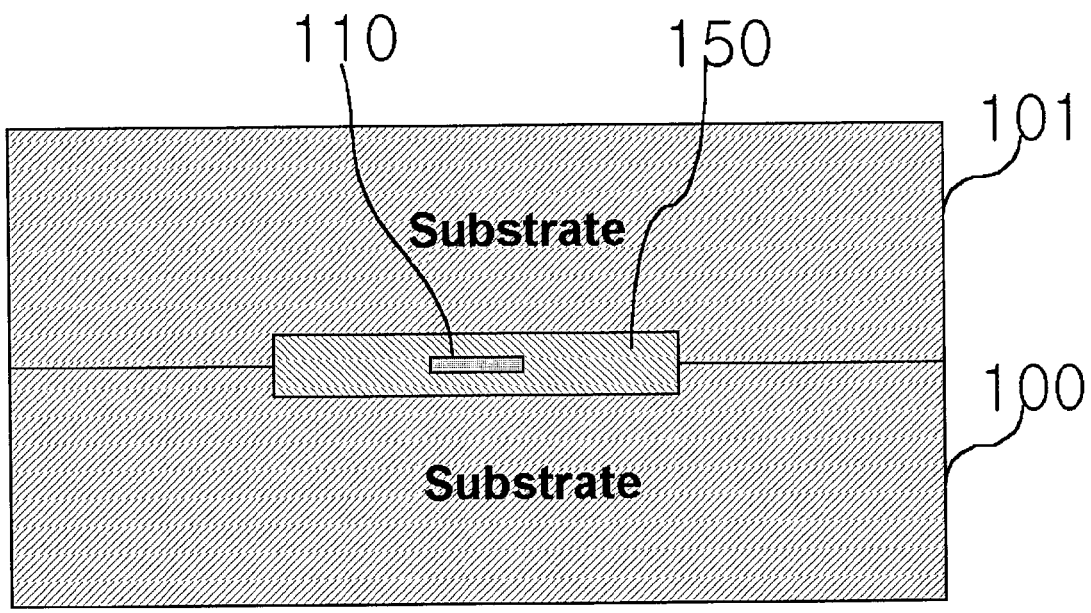
FIG. 4(b) is a cross-sectional view along A—A line shown in FIG. 4(a)

FIG. 4(a) is a longitudinal sectional view of a multi-layered substrate having a noise absorbing and shielding part embedded therein, according to the present invention. As shown in FIG. 4(a), a circuit pattern (strip line) 110 is formed as a conductive line such as copper (Cu) or silver (Ag) between, substrates 100 and 101. Further, the circuit pattern 110 is surrounded by a magnetic material 150, for example, ferrite. FIG. 4(b) is a cross-sectional view of the multi-layered substrate of FIG. 4(a). As shown in FIG. 4(b), the circuit pattern 110 which is surrounded by the ferrite 150 is interposed into the substrates 100 and 101.

Figure 5:
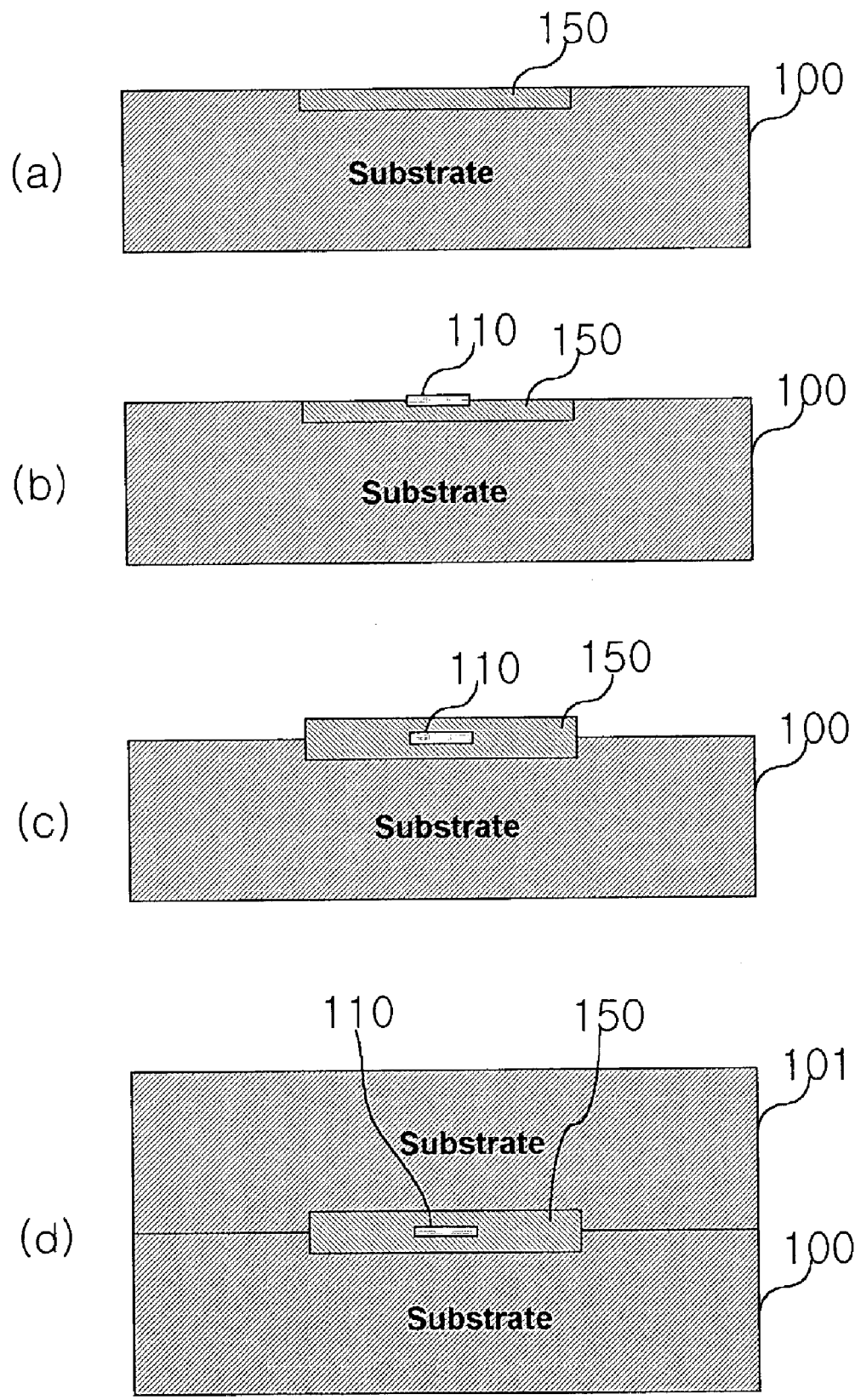
FIGS. 5(a) through 5(d) are sectional views sequentially illustrating a process of embedding the noise shielding part into the multi-layered substrate, according to the present invention.

Turning now to FIGS. 5(a) through 5(d), there is sequentially shown a process of embedding the noise shielding part into the multi-layered substrate, according to the present invention. In FIG. 5(a), a first substrate 100 is prepared, and the magnetic material, for example, ferrite 150 is disposed to an upper portion of the first substrate 100. In FIG. 5(b), on the plated ferrite 150, the circuit pattern 110 is printed. In FIG. 5(c), after the circuit pattern 110 is printed, the ferrite 150 is further disposed on the printed circuit pattern 110, and thus surrounds the circuit pattern 110. Finally, in FIG. 5(d), a second substrate 101 is layered on the circuit pattern 110 which is surrounded by the ferrite 150.

In the present invention, the magnetic material 150 and the circuit pattern 110 are sequentially formed on the first substrate 100. Alternatively, on the first substrate 100, the circuit pattern 110 may be firstly formed and then the magnetic material may be disposed on the circuit pattern 110. That is, the processes of forming the circuit pattern on the substrate and then disposing the magnetic material on the circuit pattern may be performed, and the processes of disposing the magnetic material on the substrate and then forming the circuit pattern on the magnetic material may be carried out.

Preferably, the magnetic material includes ferrite. However, any magnetic material may be used so long as leaked magnetic flux or noise is shielded. Examples of a passive component include resistors, capacitors and inductors, while an active component includes semiconductor chips.

Since the circuit pattern 110 is surrounded by the magnetic material, noise is shielded. In addition, the active component and the passive component may be surrounded by the magnetic material 150 as in the circuit pattern, thereby shielding the leaked magnetic flux and noise. Also, it is preferable that the magnetic material 150 is disposed by means of a plating process or a vacuum depositing process.

Figure 6:
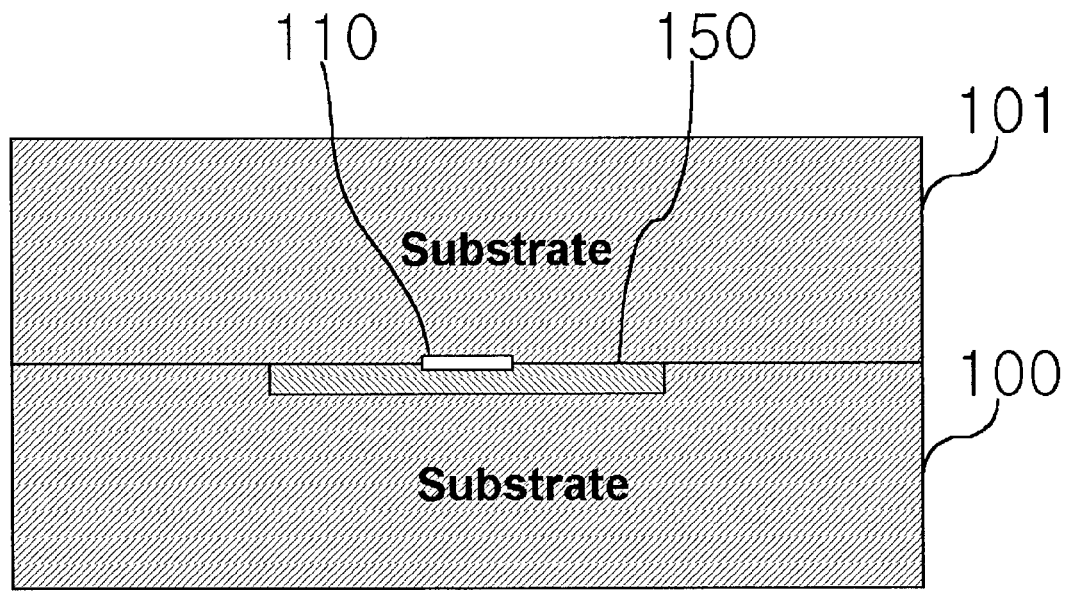
FIG. 6 is a sectional view of a multi-layered substrate according to a primary embodiment of the present invention.

FIG. 6 illustrates the multi-layered substrate according to a primary embodiment of the present invention. As shown in FIG. 6, the circuit pattern 110 positioned between the substrates 100 and 101 is printed on the magnetic material 150 which is disposed on the substrate 100. The circuit pattern 110 is not totally shielded, but any one surface of the circuit pattern 110 is shielded by the magnetic material. That is, any one surface of the circuit pattern 110 between the substrates is covered with the magnetic material, so that downward noise of the circuit pattern 110 can be shielded.

Therefore, according to the multi-layered substrate and circuit design as in FIG. 6, the magnetic material is disposed (plated or vacuum deposited) only at a desired position, whereby a desired direction of noise is shielded. In addition to the circuit pattern, even in a case where the passive and the active components are mounted between the substrates, the magnetic material may be selectively disposed on any one surface of the components. Thereby, the noise generated from the above component is shielded, and leaked magnetic flux and cross-talk relative to neighboring parts or layers are prevented. Consequently, the noise problem is solved so that each part can function normally.

Figure 7:
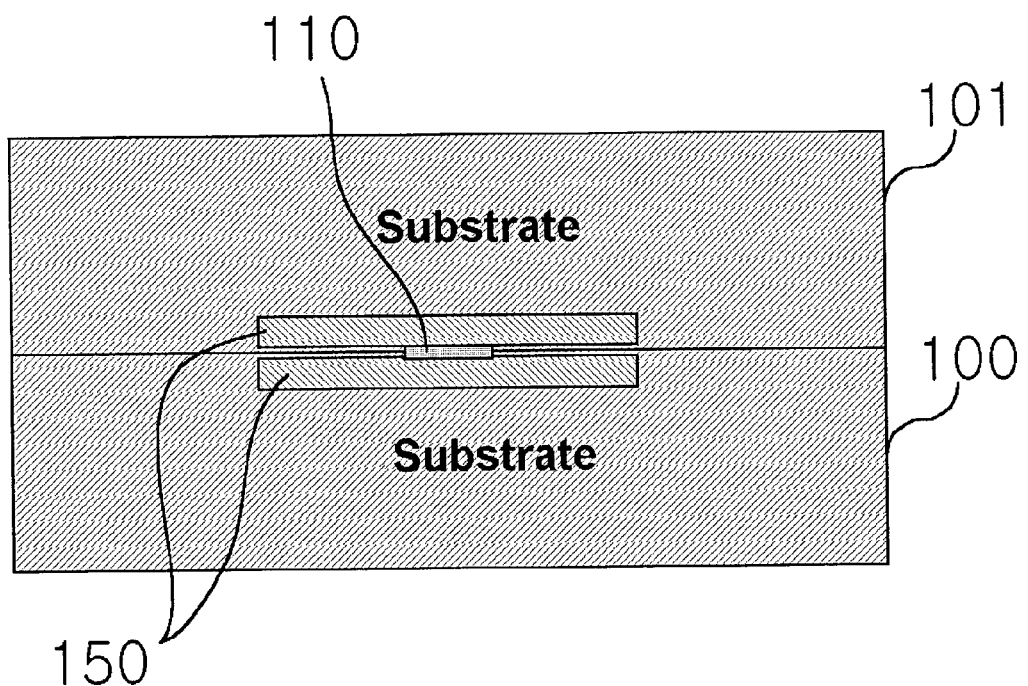
FIG. 7 is a sectional view of the multi-layered substrate according to a second embodiment of the present invention.

FIG. 7 illustrates the multi-layered substrate according to a second embodiment of the present invention. As shown in FIG. 7, the circuit pattern 110 interposed into the substrates 100 and 101 is printed between the magnetic material 150 respectively formed on a top surface of the substrate 100 and a bottom surface of the substrate 101, and thus both surfaces of the circuit pattern 110 are shielded by the magnetic material. That is, the top and the bottom of the circuit pattern 110 printed between the multi-layered substrates are covered with the magnetic material, whereby upward and downward noise of the circuit pattern 110 is shielded.

According to the multi-layered substrate and circuit design as in FIG. 7, the magnetic material is disposed on the top and the bottom of the substrate, and noise originating from both sides of the substrate can be shielded. In addition to the circuit pattern, the magnetic material is disposed at both surfaces of the component even when either of the passive component or the active component is mounted between the substrates, thus shielding noise generated from the component. Thereby, leaked magnetic flux and cross-talk relative to neighboring components or layers are prevented, and each part can function normally.

Figure 8:
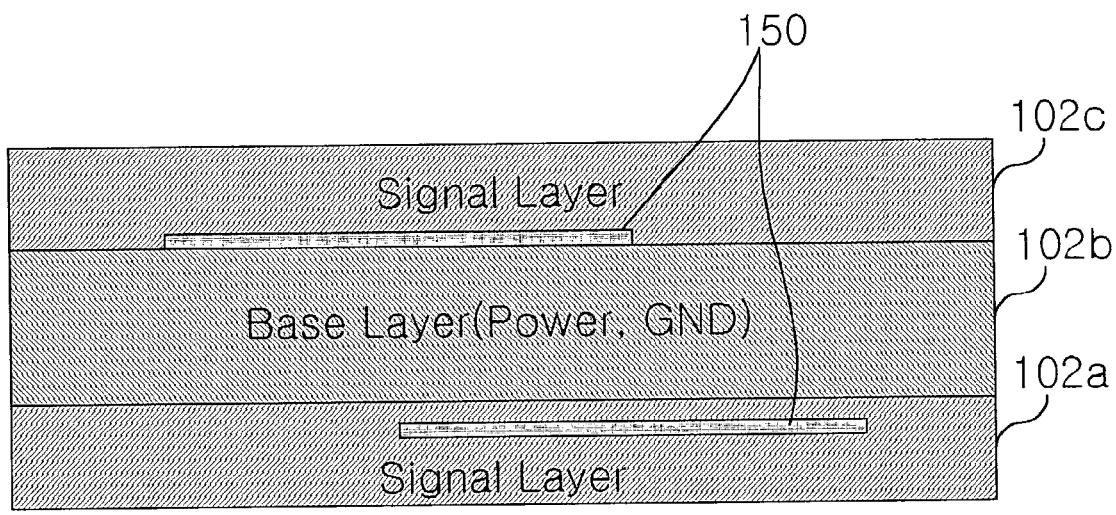
FIG. 8 is a sectional view of the multi-layered substrate according to a third embodiment of the present invention.

FIG. 8 illustrates the multi-layered substrate according to a third embodiment of the present invention, having shielding parts capable of absorbing and shielding noise embedded in the substrate. As shown in FIG. 8, as the circuit pattern, a base layer 102b is formed with power lines and ground (GND) lines. In addition, at a top and a bottom of the base layer 102b, signal layers 102(a) and 102(c) having signal lines are formed. The shielding part interposed into the top boundary portion of the base layer 102b and the signal layer 102c is formed with the magnetic material 150, whereby noise generated from the power lines of the base layer 102b is shielded. Further, another shielding part in the signal layer 102a is formed with the ferrite 150 to restrain noise generated from the signal lines. Since generated noise produces a magnetic field and gives a cross-talk effect on neighboring circuit patterns, passive and active components, noise shielded from the power lines and the signal lines minimizes the cross-talk.

Figure 9:
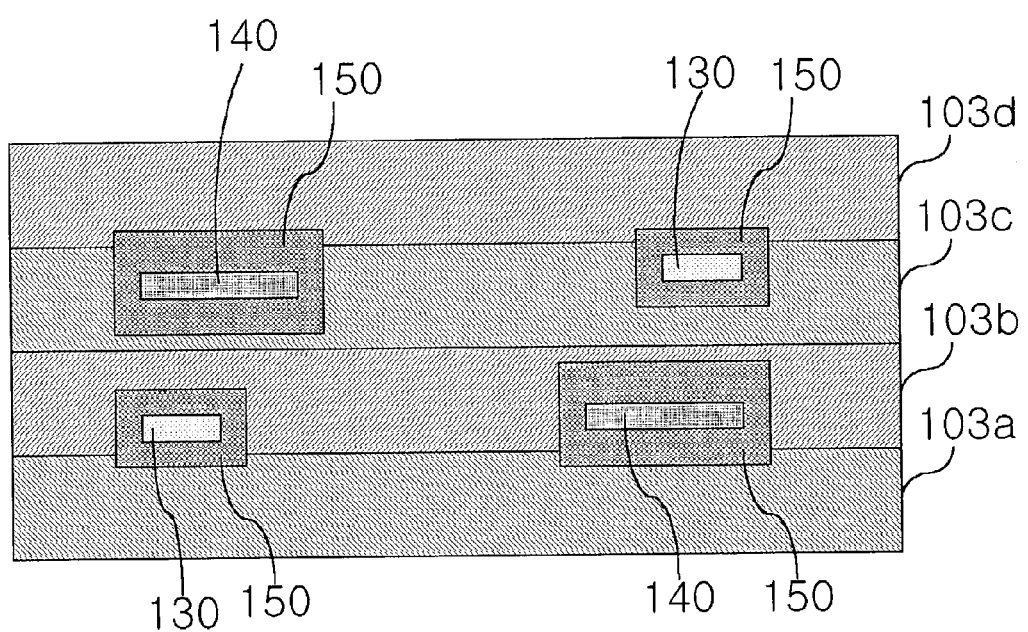
FIG. 9 is a sectional view of the multi-layered substrate according to a fourth embodiment of the present invention.

FIG. 9 illustrates the multi-layered substrate according to a fourth embodiment of the present invention, having embedded noise shielding parts therein. As shown in FIG. 9, a resin layer 103(b) is formed between substrates 103(a) and 103(c), and another resin layer 103(d) is formed on the substrate 103(c). In such a case, the circuit pattern, the passive component or the active component is formed in the substrate or the resin layer, or between the substrates and between the substrate and the resin layer, and is surrounded by the ferrite. Thereby, noise generated from each part and component can be shielded. That is, a semiconductor chip 140 as the active component is surrounded by the ferrite 150, and a passive component 130 is plated with the ferrite 150. In addition, the circuit pattern, such as power lines, ground lines and signal lines, is surrounded by the ferrite 150, and thus the effect of cross-talk due to noise on neighboring circuit patterns and various electronic parts is minimized.

In the above embodiments, the magnetic material is preferably disposed by means of the plating process or vacuum depositing process.

Figure 10A:
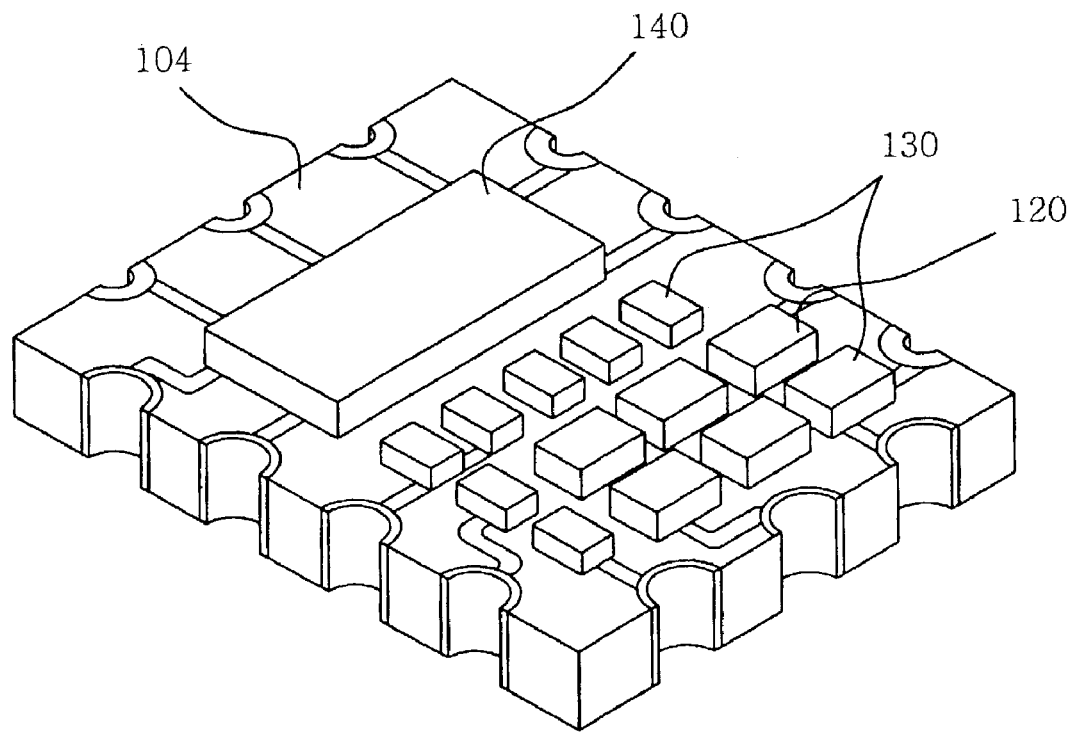
FIG. 10(a) is a perspective view illustrating the state of an active component and a passive component being mounted on the multi-layered substrate.
Figure 10B:
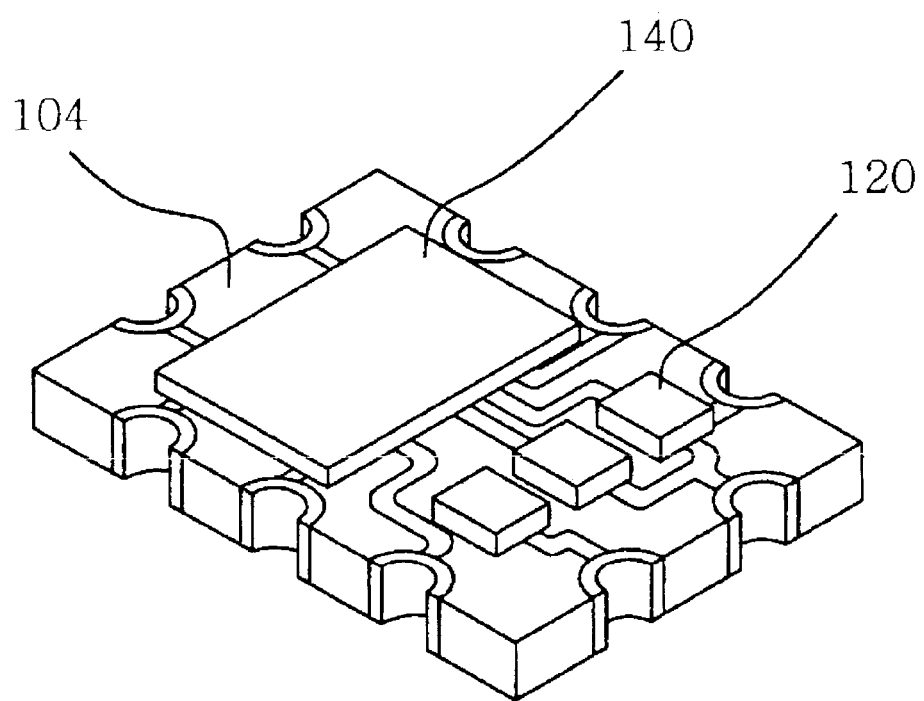
FIG. 10(b) is a perspective view illustrating the state of the active component being mounted on the multi-layered substrate and the passive component being mounted in the substrate.

FIGS. 10(a) and 10(b) illustrate the embedded noise absorbing parts in the multi-layered substrate. As shown in FIG. 10(a), a semiconductor chip 140, an active component 120 and a passive component 130 are mounted on a multi-layered substrate 104. As shown in FIG. 10(b), the semiconductor chip 140 and the active component 120 are mounted onto the substrate 104, and the passive component is embedded in the substrate 104, thereby substantially decreasing size and thickness of the substrate 104 by half, thus lowering a manufacturing cost of the substrate.

Figure 11:
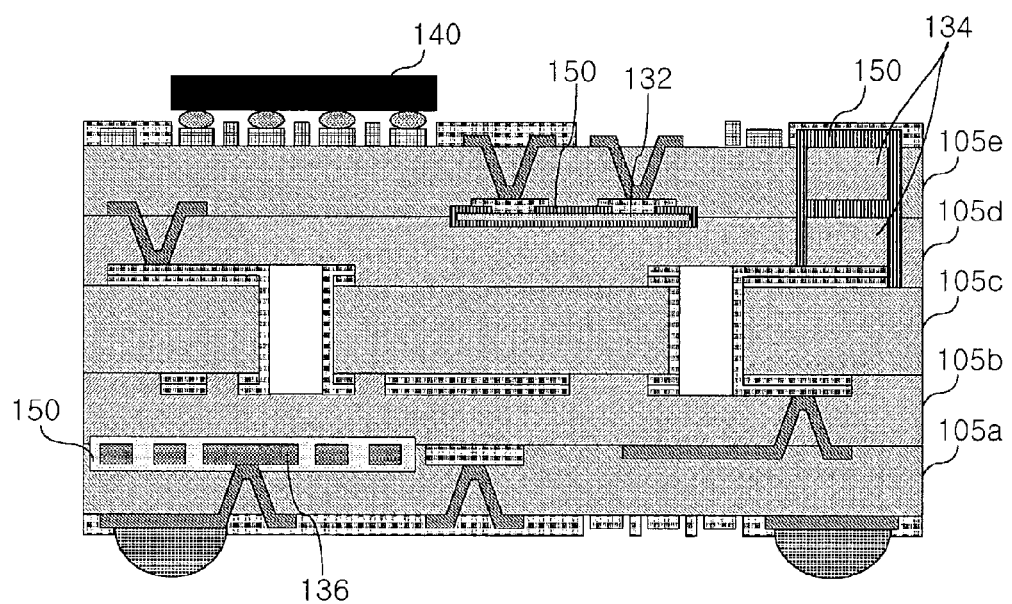
FIG. 11 is a sectional view illustrating the state of noise absorbing parts being embedded in the multi-layered substrate.

FIG. 11 a sectional view of the multi-layered substrate having embedded passive components therein. As shown in FIG. 11, a semiconductor chip 140 is mounted on multi-layered substrates 105(a), 105(b), 105(c) and 105(d), and a resistor 132, a capacitor 134 and an inductor 136, as the passive components, are embedded between the substrates, and covered with the magnetic material 150 (by means of plating or vacuum depositing). In FIG. 11, the passive components covered with the ferrite are mounted on each layer of the multi-layered substrate, and each component is electrically connected through circuit patterns. In addition to the passive components, the active component such as the semiconductor component may be embedded in the substrate.

Figure 12:
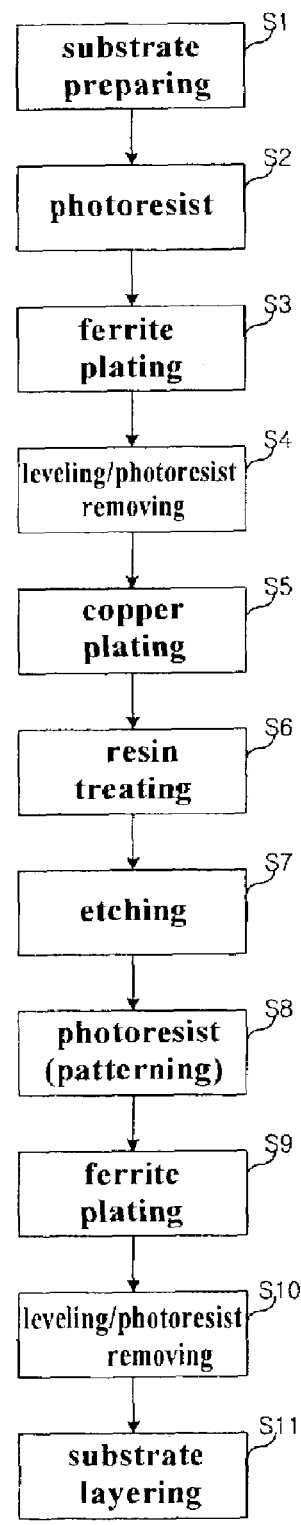
FIG. 12 is a flow chart sequentially illustrating a process of manufacturing a multi-layered substrate having embedded noise absorbing parts therein, according to the present invention.

FIG. 12 illustrates a process of manufacturing a multi-layered substrate having embedded noise absorbing parts therein according to the present invention, comprising the steps of preparing a substrate (S1), patterning the substrate by means of a photoresist (S2), disposing (plating or vacuum depositing) a magnetic material on the photoresist pattern (S3), leveling the magnetic material-disposed substrate and removing the photoresist from the substrate (S4), and disposing a conductive material for electric connection of each part (S5). In order to prevent degradation of the conductive material by an etching solution used in the next etching process, the conductive material is treated with a resin to protect the conductive material (S6).

Further, the manufacturing process includes etching the resin-treated conductive material (S7), patterning the etched conductive material by means of a photoresist (S8), disposing the magnetic material on the photoresist pattern (S9), leveling the magnetic material-disposed substrate and removing the photoresist from the substrate (S10), and layering another substrate on the substrate (S11). As such, the magnetic material comprises preferably ferrite, and is formed by means of the plating process or vacuum depositing process.

It will be apparent that shielding parts and semiconductor chip packages fabricated by the method of manufacturing the multi-layered substrate having embedded noise shielding parts therein of the present invention, are contained in the present invention.

As described above, according to the present invention, each of the circuit pattern, the passive and the active components is covered with the ferrite, to absorb noise in the multi-layered substrate. Thereby, noise and leaked magnetic flux generated from the circuit pattern, the passive components and the active components can be shielded. Thus, neighboring circuit patterns, passive components and active components can function normally. Further, since the multi-layered substrate has embedded noise shielding parts, size and thickness of the multi-layered substrate are decreased to lower manufacturing costs of the substrate.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A multi-layered substrate, comprising:
   a first substrate;
   a second substrate layered on the first substrate;
   a circuit pattern printed between the first substrate and the second substrate; and
   a magnetic material imbedded in at least one surface of a top and a bottom of the circuit pattern to provide a noise shield.

2. The substrate as defined in claim 1, wherein the circuit pattern is surrounded by the magnetic material.

3. The substrate as defined in claim 1, wherein the circuit pattern is any one selected from among signal lines, ground lines or power lines.

4. The substrate as defined in claim 1, wherein the magnetic material comprises ferrite.

5. A multi-layered substrate, comprising:
   a first substrate;
   a second substrate layered on the first substrate;
   a passive component mounted between the first substrate and the second substrate; and
   a noise shield for limiting magnetic fields and including a magnetic material imbedded in one of said substrates adjacent to one of one surface of a top and a bottom of the passive component.

6. The substrate as defined in claim 5, wherein the passive component is surrounded by the magnetic material.

7. The substrate as defined in claim 5, wherein the passive component includes resistors, capacitors and inductors.

8. The substrate as defined in claim 5, wherein the magnetic material comprises ferrite.

9. A type multi-layered substrate, comprising:
a first substrate;
a second substrate layered on the first substrate;
an electric component mounted between the first substrate and the second substrate; and
a magnetic material imbedded in at least one of said first and second substrates and disposed on at least one surface of a top and a bottom of the electric component mounted between the first substrate and the second substrate, said magnetic material forming a noise shield for said electric component.

10. The substrate as defined in claim 9, wherein the electric component is surrounded by the magnetic material.

11. The substrate as defined in claim 9, wherein the electric component includes semiconductor chips.

12. The substrate as defined in claim 9, wherein the magnetic material comprises ferrite.

13. The substrate of claim 5 wherein said magnetic material is imbedded one of said first and second substrates.

14. The substrate of claim 5 wherein said shield includes a first magnetic layer disposed on top of the passive component and a second magnetic layer disposed on the bottom of the passive component.

15. The substrate of claim 14 wherein said magnetic layers are in contact with said passive component.

16. The substrate of claim 5 wherein magnetic material is deposited on said passive component.

17. The substrate of claim 5 wherein at least one of said first and second substrates is formed with a cavity and said magnetic material is disposed in and fills said cavity.

18. The substrate of claim 9 wherein said electric component is one of a signal conductor, a power conductor and an electric element.

19. The substrate of claim 9 wherein said magnetic material includes a first magnetic layer disposed on top of the electric component and a second magnetic layer disposed on the bottom of the electric component.

20. The substrate of claim 19 wherein said magnetic layers are in contact with the electric component.

21. The substrate of claim 9 wherein magnetic material is deposited on said electric component.

22. The substrate of claim 9 wherein at least one of said first and second substrates is formed with a cavity and said magnetic material is disposed in and fills said cavity.

* * * * *